United States Patent [19]

Wolf et al.

[11] Patent Number: 4,495,220
[45] Date of Patent: Jan. 22, 1985

[54] POLYIMIDE INTER-METAL DIELECTRIC PROCESS

[75] Inventors: Stanley Wolf, Sunset Beach; Warren C. Atwood, Los Angeles, both of Calif.

[73] Assignee: TRW, Inc., Redondo Beach, Calif.

[21] Appl. No.: 540,064

[22] Filed: Oct. 7, 1983

[51] Int. Cl.³ .................................. H01L 21/312
[52] U.S. Cl. ............................ 427/82; 156/643; 156/644; 156/653; 156/657; 156/659.1; 156/668; 204/192 E; 427/85; 427/89; 427/95; 430/313; 430/314
[58] Field of Search .............. 427/85, 89, 95, 82; 204/192 E; 156/643, 644, 653, 657, 668, 659.1; 430/313, 314

[56] References Cited

U.S. PATENT DOCUMENTS

| | | | |
|---|---|---|---|
| 3,700,497 | 10/1972 | Epifano | 427/82 |
| 3,985,597 | 10/1976 | Zielinski | 427/90 |
| 4,328,262 | 5/1982 | Kurahasi | 427/82 |
| 4,357,203 | 11/1982 | Zilez | 156/668 |
| 4,430,153 | 2/1984 | Gleason | 427/93 |

Primary Examiner—John D. Smith
Attorney, Agent, or Firm—Robert M. Wallace; Noel F. Heal

[57] ABSTRACT

A technique for employing polyimide as an inter-metal dielectric layer, while avoiding the difficulties usually associated with this material. An upper layer of silicon dioxide is employed as a hard mask over the polyimide, and is highly doped with phosphorous to prevent thermal cracking. Via holes are formed in a multi-stage etching process that includes a first dry-etching step that effects isotropic etching to form holes with desirably sloped sidewalls, and a second dry-etching step that effects anisotropic etching to extend the via holes through to a lower metal surface without significantly enlarging the holes in width. Finally, a dry-etching step is used to remove any residue of polyimide and to strip the silicon dioxide layer from over the polyimide. The bottom of the hole is then sputter-etched prior to metallization. In one preferred form of the method, a lower layer of silicon dioxide is formed between the lower metal layer and the polyimide layer, to facilitate removal of polyimide residue and to act as a barrier between the lower metal and the polyimide.

11 Claims, 6 Drawing Figures

POLYIMIDE INTER-METAL DIELECTRIC PROCESS

This invention was made with Government support under N00039-81-C-0414 awarded by the Department of the Navy.

BACKGROUND OF THE INVENTION

This invention relates generally to integrated circuits, and more particularly, to techniques for insulating multiple conductive layers in integrated circuit structures. In many integrated circuit designs, multiple patterned layers of conductive metal are used to interconnect the circuit components. The layers must be insulated from each other by a dielectric layer, but there is also a requirement that electrical contact may be made through the dielectric layer at selected locations. This is typically effected by means of openings in the dielectric, called via holes, the sidewalls of which are coated with metal to complete the electrical connection through the dielectric layer.

Silicon dioxide ($SiO_2$) is probably the material most commonly used as a dielectric between metal layers. While satisfactory in most respects, silicon dioxide also has some shortcomings, one of which is that it does not always provide good coverage over steps in the planar topography of a wafer. Since a first of the metal layers will typically be patterned before the dielectric layer is formed, steps in the topography will be commonplace. Polyimide, which has been suggested as a substitute for silicon dioxide and other materials, has suitable thermal and electrical properties and is chemically inert. It has the additional advantage that it partially planarizes the wafer topography, and therefore improves the step coverage of overlying metal layers.

However, there are at least two major problems associated with the use of polyimide as an intermetal dielectric layer. One is that the opening of a via hole through the polyimide layer is rendered difficult by the production of a residue of polyimide, which accumulates at the bottom of the via hole, over the lower level metal layer. Unless the residue is completely removed, it can prevent good electrical connection between the metal layers. A second problem is that polyimide tends to absorb water, which may result in corrosion of the metal.

Prior to the present invention, the most reliable method of removing the polyimide residue was to sputter-etch the bottom of the via hole prior to the deposition of metal in the hole. However, this technique has been found not to work well for via holes of small dimensions, such as two micrometers by two micrometers or smaller.

Wet-etching of polyimide through a patterned photoresist layer is generally suitable for via sizes down to three micrometers in size. For smaller geometries, a dry etching process may be used. Unfortunately, dry-etching in an oxygen plasma, using a positive photoresist mask to define the via holes, is of only limited utility, since the oxygen plasma erodes the photoresist at about the same rate as it erodes the polyimide. A non-erodable or hard mask is required, as recognized by G. Samuelson in "Polyimide for Multilevel VLSI and Alpha Protection," from a course on "Polyimide Coatings for Microelectronics with Applications," Continuing Education in Engineering, Univ. of Cal., Berkeley, 1981.

Another consideration is that it is usually desirable to produce via holes with sloping sidewalls, since metallization of the hole will then be greatly facilitated. However, in order to ensure that all of the polyimide material has been removed from all of the via holes, it is necessary to include a prolonged "overetch" step. The risk in such a step is that some of the via holes may be enlarged too much in width.

It will be appreciated from the foregoing that there is still a need for improvement in techniques for using polyimide as a dielectric between metal layers. Ideally, the via holes in polyimide should be suitably shaped with sloped side walls, while retaining control over the feature sizes at the top and bottom of the via holes. In addition, the polyimide residue must be totally removed, to provide good electrical contact with the lower metal layer. It would also be desirable to preclude any possible moisture damage to the lower metal layer, which may be caused by direct contact with the polyimide. The present invention is directed to a technique with these ideal characteristics.

SUMMARY OF THE INVENTION

The present invention resides in an improved process for forming metallized via holes in a polymide film between two metal layers. Basically, and in general terms, the method of the invention comprises the steps of forming a polyimide layer over a lower metal layer, forming a mask layer of silicon dioxide doped with phosphorous, over the polyimide layer, and etching via hole pattern in the silicon dioxide layer. During a first-stage dry-etching step, a via hole with sloped sidewalls is formed in the polyimide. Then a second-stage dry-etching step overetches the hole without significantly enlarging it further in width, and a final dry-etching step ensures removal of the residue of polyimide material. The metal surface in the via hole is then sputter-etched before a metal deposition step covers the sidewalls and bottom of the via hole, and the upper surface of the polyimide layer.

More specifically, in the first stage of dry-etching, isotropic etching takes place, using oxygen in a plasma etcher. In the second stage of dry-etching, oxygen is used in a reactive ion etcher, which provides anisotropic etching and produces practically perpendicularly etched walls, to avoid further enlargement of the hole, but also to ensure total removal of polyimide material. The dry-etching step not only removes residue from the hole, but also strips the silicon dioxide layer from the polyimide prior to sputter-etching and metallization.

In accordance with another important aspect of the invention, a lower layer of silicon dioxide is formed between the lower metal layer and the polyimide. This lower layer of silicon dioxide functions both to facilitate removal of the polyimide residue, and as a protective layer separating the lower metal layer from the polyimide.

It will be appreciated from the foregoing that the present invention represents a significant advance in the field of integrated circuit fabrication technology. In particular, the invention provides a reliable technique for forming metallized via holes in a polyimide intermetal layer, and overcomes problems inherent in prior approaches using polyimide for this purpose. Other aspects and advantages of the invention will become apparent from the following more detailed description, taken in conjunction with the accompanying drawings.

DESCRIPTION OF THE PREFERRED EMBODIMENTS

Figure 1A:
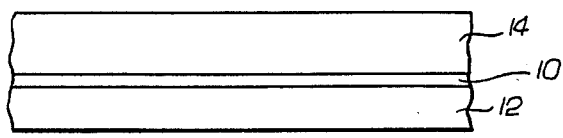
FIGS. 1a–1f are cross-sectional views depicting the process steps in accordance with one embodiment of the invention.

As shown in the drawings for purpose of illustration, the present invention is concerned with techniques for forming via holes in polyimide film used as an intermetal dielectric layer in integrated circuitry. Polyimide has the desirable characteristics of thermal stability and chemical inertness, and also has good dielectric properties. An advantage over other dielectrics is improved planarization properties over stepped wafer patterns. Its principal disadvantages are the difficulty of removing a residue of polyimide after etching, and a potential problem arising from its moisture absorbing characteristics.

In accordance with the invention, via holes can be formed in polyimide with desirable sloped sidewalls, but without sacrificing accuracy of definition at the tops and bottoms of the holes. The problems of residue removal and absorbed moisture are also obviated by the process of the invention.

As shown in FIG. 1a, the first step of the process is to form a silicon dioxide layer, indicated by reference numeral 10, over a metal layer 12, by a conventional process step, such as chemical vapor deposition (CVD). In accordance with a variant form of the invention, this first step may be omitted entirely, although this will result in the loss of some of the advantages of the invention, as further explained below.

The second step of the process, also shown in FIG. 1a, is the formation of a polyimide film or layer 14. Preferably, the polymide film should be approximately 9,000 angstroms in thickness, compared with about 1,000 angstroms for the silicon dioxide layer 10. The polyimide film 14 may be any suitable compound, for example DuPont P.I. 2555. If the polyimide film 14 is formed directly on the metal layer 12, the latter should first be wet-etched in a suitable etchant. The film 14 is best applied with an adhesion promoter and may be spun on. To obtain a fully cured film, the polyimide is first baked at 150 degrees C. for 30 minutes, 300 degrees C. for 60 minutes, and finally 410 degrees C. for 15 minutes. The resulting film 14 is approximately 0.8–0.9 micrometer thick.

Figure 1B:
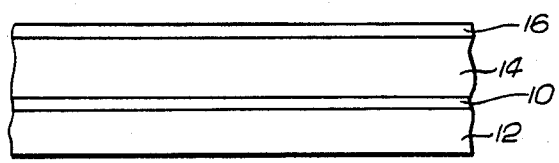

As shown in FIG. 1b, the next step is to form an upper silicon dioxide layer 16 by chemical vapor deposition. This layer 16 is doped with phosphorous to a concentration of about 8 to 10 percent, to prevent cracking of the layer due to the different thermal expansion coefficients of silicon dioxide and polyimide. Any cracking of the silicon dioxide may be transferred to the polyimide layer 14, where it would be manifested as breaks or tears in the polyimide film. Doping of silicon dioxide to about 4 percent is common, but higher doping levels are not normally used because they tend to promote corrosion in adjacent layers. It has been found, however, that phosphorous in concentrations up to 8–10 percent prevents the thermal cracks from forming. Since the silicon dioxide layer 16 is later removed, there is no problem with possible corrosion effects of the phosphorous. The lower silicon dioxide layer 10 includes only about 4 percent of phosphorous.

Figure 1C:
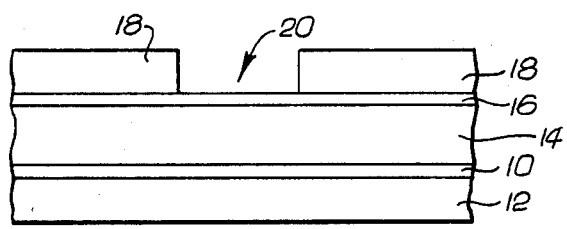
Figure 1D:
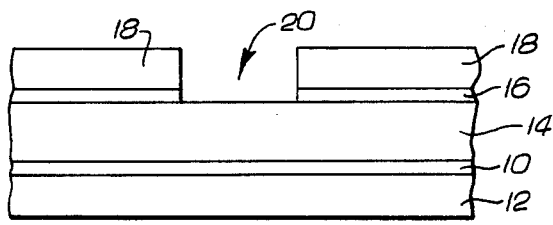

In the next step, shown in FIG. 1c, a positive photoresist layer 18 is deposited over the silicon dioxide layer 16, and is patterned by conventional photolithographic tenchiques, to define via hole positions, one of which is shown at 20. In the next step, shown in FIG. 1d, the silicon dioxide layer 16 is etched away at the via hole position 20, using an etchant that does not react with the photoresist material.

Figure 1E:
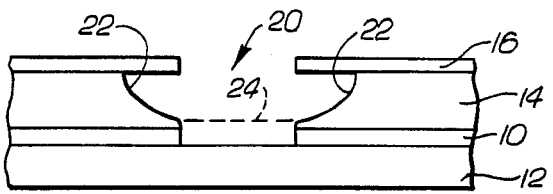

The next step involves two stages of a dry-etching process. In the first stage, the polyimide layer 14 is partially etched in a plasma etcher, which causes isotropic etching and forms a via hole with sloping sidewalls, as indicted at 22 in FIG. 1e. This step may also remove the photoresist layer 18. The first dry-etching stage uses oxygen as the etchant, and in the preferred arrangement, employs an LFE plasma etching machine operating at a power of 500 watts and a pressure of 1,000 microns or one Torr. The nature of this etching stage is that the polyimide layer 14 is etched away beneath the hard mask formed by the silicon oxide layer 18. The sides of the hole at the via position 20 are sloped as desired. The hole is extended as far as desired in width but does not extend all the way to the lower silicon dixide layer 10, as indicated by the broken line 24 in FIG. 1e.

In the second-stage etching step, the via hole is extended further in depth, but not significantly further in width. This step uses oxygen as the etchant, but in a reactive ion etcher that causes anisotropic etching, such as the Plasma-Therm model 2440, at a power of 500 watts and a pressure of 50 microns. The purpose of the second stage of dry etching is to "overetch" the hole, to make sure that all of the holes in the device have been etched all the way through. If the first-stage etching step had been continued as the overetch step, some of the via holes would have been made much too wide. Hence the use of the anisotropic etch, which is much more directional and does not significantly widen the via hole.

Figure 1F:
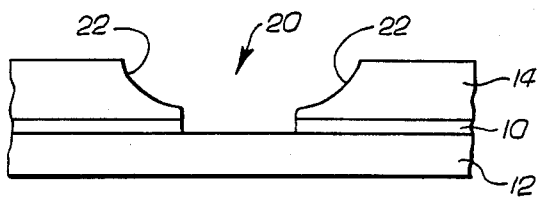

The next and final step to be illustrated is that of FIG. 1f, which shows the resulting structure after a step of dry-etching both to remove any polyimide residue from the via hole, and to strip away the upper silicon dioxide layer 16. A suitable fluoride-based etchant gs may be used, such as trifluoromethane ($CHF_3$). $CHF_3$ has the advantage that it etches CVD $SiO_2$ at a rate approximately three times that at which it etches fully-cured polyimide. Therefore, the silicon dioxide can be safely removed without unnecessarily enlarging the via hole. Moreover, this etch is anisotropic in nature, and does not tend to undercut the lower silicon dioxide layer 10. Subsequently, a metallization layer (not shown) is applied over the via hole and the upper surface of the polyimide film 14. Preferably, the lower metal layer 12 is sputter-cleaned in the area of each via hole prior to this metallization step, to ensure good electrical contact between the lower metal layer 12 and the upper metal layer (not shown).

It will be appreciated from the foregoing that the present invention represents a significant advance in the field of integrated circuit fabrication. Specifically, the invention provides a reliable technique for forming via holes in a polyimide film. It will also be appreciated that, although a specific embodiment of the invention has been described in detail for purposes of illustration, various modifications may be made without departing from the spirit and scope of the invention. For example, as previously mentioned, the lower silicon dioxide layer may be omitted and many of advantages of the invention still retained. Accordingly, the invention is not to be limited except as by the appended claims.

We claim:

1. A method for forming via holes in a polyimide dielectric film, said method comprising the steps of:
    forming a polyimide layer over a lower metal layer in a semiconductor circuit;
    forming an upper layer of silicon dioxide highly doped with phosphorous, over the polyimide layer;
    etching a via hole pattern in the silicon dioxide layer;
    dry-etching a sloped-walled via hole in the polyimide;
    dry-etching the hole all the way through to the metal layer, but without significantly enlarging the hole further in width; and
    etching the hole to remove any residue of polyimide material, and to remove the upper layer of silicon dioxide.

2. A method as set forth in claim 1, and further comprising the steps of:
    sputter-etching the metal surface at the bottom of the via hole; and
    depositing a layer of metal over the upper surface of the polyimide layer and over the walls of the via hole, to make electrical contact with the lower metal layer at the bottom of the hole.

3. A method as set forth in claim 1, wherein:
    said first-recited dry-etching step is an isotropic etching step using a plasma etcher; and
    said second-recited dry-etching step is an anisotropic etching step using a reactive-ion etcher to overetch the hole without significantly enlarging it in width.

4. A method as set forth in claim 1, wherein:
    said method further includes the step of forming a lower layer of silicon dioxide on the lower metal layer;
    said step of forming the polyimide layer forms the layer over the lower layer of silicon dioxide; and
    said second-recited dry-etching step and said last-recited etching step also effects removal of a portion of the lower silicon dioxide layer;
    whereby the lower silicon dioxide layer facilitates removal of all polyimide residue from the via hole, and acts as a barrier layer between the polyimide and the lower metal layer.

5. A method as set forth in claim 4, wherein:
    said first-recited dry-etching step is an isotropic etching step using a plasma etcher; and
    said second-recited dry-etching step is an anisotropic etching step using a reactive-ion etcher to overetch the hole without significantly enlarging it in width.

6. A method as set forth in claim 1, wherein:
    the upper silicon dioxide layer is doped with phosphorous to a concentration of approximately eight to ten percent.

7. A method as set forth in claim 1, wherein said step of etching a via hole pattern in the upper silicon dioxide layer includes:
    forming a photoresist layer over the upper silicon dioxide layer;
    patterning the photoresist layer photolithographically;
    selectively removing portions of the photoresist layer to define the hole pattern; and
    etching the upper silicon dioxide layer through the hole pattern in the photoresist layer.

8. A method as set forth in claim 1, wherein:
    said last-recited etching step is a dry-etching step.

9. A method as set forth in claim 1, wherein:
    said last-recited etching step is a dry etching step using trifluoromethane ($CHF_3$) as an etchant.

10. A method for forming via holes in a polyimide dielectric film, said method comprising the steps of:
    forming by chemical vapor deposition a lower layer in a semiconductor circuit of silicon dioxide over a lower metal layer;
    forming a polyimide layer over the lower silicon dioxide layer and the lower metal layer;
    curing the polyimide layer;
    forming by chemical vapor deposition an upper layer of silicon dioxide doped with phosphorous to about eight to ten percent to prevent cracking, over the polyimide layer;
    forming a patterned photoresist layer over the upper silicon dioxide layer, to define a via hole pattern;
    etching the via hole pattern in the silicon dioxide layer;
    dry-etching a sloped-walled via hole in the polyimide with an isotropic etching process using oxygen in a plasma etcher;
    dry-etching the hole all the way through to the metal layer, but without significantly enlarging the hole further in width, with an anisotropic etching process using oxygen in a reactive-ion etcher;
    dry-etching the hole to remove any residue of polyimide material, and to remove the upper layer of silicon dioxide;
    sputter-etching the metal surface at the bottom of the hole; and
    depositing an upper layer of metal over the polyimide layer and extending over the surfaces of the via hole to make electrical contact with the lower metal layer.

11. A method as set forth in claim 10, wherein:
    said last-recited dry-etching step uses trifluoromethane ($CHF_3$) as an etchant.

* * * * *